United States Patent [19]
Sandhu et al.

[11] Patent Number: 5,252,518
[45] Date of Patent: Oct. 12, 1993

[54] METHOD FOR FORMING A MIXED PHASE TIN/TISI FILM FOR SEMICONDUCTOR MANUFACTURE USING METAL ORGANOMETALLIC PRECURSORS AND ORGANIC SILANE

[75] Inventors: Gurtej S. Sandhu; Trung T. Doan, both of Boise, Id.

[73] Assignee: Micron Technology, Inc., Boise, Id.

[21] Appl. No.: 845,215

[22] Filed: Mar. 3, 1992

[51] Int. Cl.$^5$ .................................... H01L 21/441
[52] U.S. Cl. .................... 437/200; 437/245; 148/DIG. 147
[58] Field of Search .............. 148/DIG. 147; 437/200, 437/245

[56] References Cited

U.S. PATENT DOCUMENTS

| | | | |
|---|---|---|---|
| 4,784,973 | 11/1988 | Stevens et al. | 437/200 |
| 4,851,369 | 7/1989 | Ellwanger et al. | 437/189 X |
| 4,977,106 | 12/1990 | Smith | 437/192 |
| 5,084,417 | 1/1992 | Joshi et al. | 437/187 X |

FOREIGN PATENT DOCUMENTS

| | | | |
|---|---|---|---|
| 0298109 | 12/1987 | Japan | 148/DIG. 147 |
| 0037850 | 2/1989 | Japan | 437/200 |

OTHER PUBLICATIONS

K. Sugiyama, S. Pac, Y. Takahashi and S. Motojima, "Low Temperature Deposition of Metal Nitrides by Thermal Decomposition of Organometallic Compounds" 122, 1545 (1975).

R. M. Fix, R. G. Gordon and D. M. Hoffman, "Titanium Nitride Thin Films by APCVD Synthesis using Organometallic Precursors"; MRS Smp. Proc. 168, 357 (1990).

D. C. Bradley and I. M. Thomas, Journal of the Chemical Society, 1960, 3857.

*Primary Examiner*—John S. Maples
*Attorney, Agent, or Firm*—Stephen A. Gratton

[57] ABSTRACT

A LPCVD method for depositing a film of TiN on a semiconductor structure includes reacting an organometallic titanium source gas such as TMAT and organic silane as a reactive gas. The deposited film is a mixed phase of TiN and TiSi$_2$ and is characterized by a low contact resistance, good step coverage and good barrier properties. The reaction is preferably carried out in a cold wall CVD reactor at relatively low temperatures (i.e. 200° C.) and at pressures of from about 0.05 to 30 Torr.

18 Claims, No Drawings

METHOD FOR FORMING A MIXED PHASE TIN/TISI FILM FOR SEMICONDUCTOR MANUFACTURE USING METAL ORGANOMETALLIC PRECURSORS AND ORGANIC SILANE

TECHNICAL FIELD

This invention relates to the formation of TiN films in semiconductor manufacture and more particularly to a novel LPCVD process for depositing TiN films by reacting organometallic precursors with organic silane.

BACKGROUND OF THE INVENTION

Titanium nitride (TiN) films are widely used in semiconductor manufacture. Titanium nitride has become an integral part of advanced metallization schemes for many ultra large scale integrated circuit (ULSI) applications. It is used for example, as a diffusion barrier against junction spiking for aluminum contacts to silicon. In addition, TiN serves as a glue layer between tungsten and inter-metal dielectrics and to preserve the junction integrity from worm hole effects during the chemical vapor deposition (CVD) of tungsten.

Almost all of the applications utilizing TiN use physical deposition methods such as reactive ion sputtering or nitridation of sputter deposited titanium in nitrogen-containing gases at high temperatures. All of these processes suffer from poor step coverage of the deposited films. In general, TiN does not have sufficient step coverage which in some applications can lead to unreliable, high leakage and high resistivity contacts. This problem is magnified for ULSI applications where sub-micron high aspect ratio contact/via holes are required.

In order to overcome this step coverage problem, CVD deposition of TiN has also been proposed. CVD of TiN is expected to give conformal step coverage because reactants or reactive intermediates diffuse rapidly along the substrate surface before reacting. TiN films deposited using titanium tetrachloride as a source gas and ammonia, hydrogen or nitrogen gas mixtures as reactive gases have been studied and evaluated for ULSI metallization in the past.

U.S. Pat. No. 4,977,106 to Smith discloses such a CVD process for the deposition of TiN using titanium tetrachloride as a source gas and either silane or SiH$_4$ and ammonia as a reactive gas. In general, however, the reaction temperatures with these processes have been high. It is known that high temperature processes may have an adverse effect on the completed semiconductor devices. In addition, the deposited films contained small amounts of chlorine impurity which can potentially cause corrosion related failure.

In addition to these problems deposition of TiN using a process such as that disclosed in the Smith patent produces a single phase TiN film. Such a film has a high contact resistance when deposited on a silicon substrate. A separate conductive layer such as Ti must therefore be initially deposited on the silicon substrate in the formation of semiconductor contacts.

To solve the problems associated with high temperatures and impurities, metal organic chemical vapor deposition (MOCVD) of TiN films using tetrakis-dimethylamino titanium [Ti(N(CH$_3$)$_2$)$_4$] (TMAT) have been proposed recently (K. Sugijama et al, SOC, Sic. 122,1545 (1975); R. M. Fix et al, MRS Smp. Proc. 168, 357 (1990). Such dialkylamino-derivatives of titanium have been known since the experiments of Bradley (Bradley et al, J. Chem. Soc., 1960, 3857) and when used as metal organic precursors permit the deposition of high purity TiN films at relatively low temperatures (i.e. 200° C). In general with such CVD processes for the deposition of TiN films, TMAT is used as a titanium source gas and ammonia is utilized as a reactive gas. A problem with such processes is that step coverage of the deposited film is poor. In addition, as with the process previously described the contact resistance at the TiN/Si interface is very high and a previously deposited layer of TiSi$_2$ is required at the contact.

There is then a need in the art for a process for conformally depositing high purity mixed phase TiN and TiSi$_x$ films having a low contact resistance at relatively low temperatures. Accordingly it is an object of the present invention to provide a process for depositing high quality and conformal mixed phase TiN/TiSi$_x$ films at low temperatures. It is a further object of the present invention to provide such a process that is suitable for large scale semiconductor manufacture. It is a further object of the present invention to provide a process for depositing mixed phase TiN/TiSi$_x$ films with metal organic chemical vapor deposition (MOCVD) or (LPCVD) using tetrakis-dimethyl-amino titanium (TMAT) as a metal source and organic silane as a source of Si and N. It is yet another object of the present invention to provide a process for depositing mixed phase TiN/TiSi$_x$ films with the deposited films characterized by a low contact resistance, good step coverage and good barrier properties.

SUMMARY OF THE INVENTION

In accordance with the present invention a low pressure LPCVD process for depositing mixed phase TiN/TiSi$_x$ films is provided. Briefly stated, the process of the invention uses a metal organic precursor such as tetrakisdimethyl-amino titanium (TMAT) as a metal source and organic silane in the form of Tris(Dimethylamino)Silane (SIN) as a reactive gas and as a source of Silicon and Nitrogen to deposit a mixed phase film of TiN+TiSi$_2$ on a substrate. The substrate, which can be in the form of a silicon wafer, is held in a reaction chamber under a vacuum for a period determined by the deposition rate and the film thickness desired.

The chemical reaction can be summarized as:

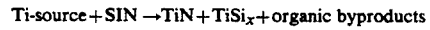

The process is preferably carried out in a cold-wall reactor at temperatures as low as 200° C. and at pressures between 0.1 to 2 Torr. The deposited film will be a mixed phase of TiN and TiSi$_2$. Only a small fraction of the film however, will be in the form of TiSi$_2$. Such a film is characterized by low contact resistance, good step coverage and good barrier properties.

Other objects, advantages, and capabilities of the present invention will become more apparent as the description proceeds.

DESCRIPTION OF PREFERRED EMBODIMENTS

LPCVD depositions of TiN on a substrate are preferably carried out in accordance with the invention in a cold-wall CVD reactor. The titanium source gas is preferably a metal organic source such as tetrakis-dimethyl-amino titanium [Ti(N(CH$_3$)$_2$)$_4$] (TMAT) Such a metal organic precursor is from a class of synthesized compounds known in the art as dialkylamino-derivatives. TMAT is liquid at room temperature and has a vapor pressure of 1 Torr at 60° C. SIN is liquid at room temperature and has a vapor pressure of 30 Torr at 60° C.

The source gas (TMAT) and an organic silane reactive gas, such as tris(dimethylamino) silane (SIN), are reacted to form a deposited film that is a mixture of TiN and $TiSi_2$. Such a mixed phase film deposited on a silicon or $SiO_2$ substrate can be used to form contacts having low contact resistance and good barrier properties. Since all the reactants are organic, deposition at low temperatures can be accomplished. A large flow of a carrier gas controls the gas distribution above the substrate surface and is used to control the uniformity of the films across the wafer.

As an example, a silicon wafer is placed in the vacuum chamber of a cold wall CVD reactor. The separate gases can then be fed into the CVD reactor through separate inlets. Helium or other gases can be used as a carrier gas and to regulate the uniformity of the film on the wafer surface. Mixed phase $TiN/TiSi_2$ films can be deposited on Si and $SiO_2$ substrates over a wide range of temperatures (40° C.–500° C.) and pressures (0.05 to 30 Torr). In general, a deposition rate of about 40 to 1000 per minute can be obtained.

For a MOCVD precursor such as TMAT, Ti supplied by the TMAT will bond with nitrogen supplied by the SIN to form TiN on the surface of the substrate. At the same time a small fraction of the Ti supplied by the TMAT will bond with silicon supplied by the SIN to form $TiSi_x$ preferably in the form of $TiSi_2$. The deposited film will thus be a mixture of TiN and $TiSi_2$. The $TiSi_2$ component of the deposited film will provide an electrical path between the contacts and the surface of the substrate. With this arrangement there is no need to deposit a separate film of $TiSi_2$ to provide a low contact resistance as the mixed phase $TiSi_2$ provides this function.

In addition to TMAT as an organic source of titanium, other organometallic precursors such as TIAZ at a flow rate of 3 to 200 sccm can also be utilized. Other sources of organic silane at a flow rate of 3 to 200 sccm may also be utilized in this application. Additionally other carrier gases such as Ar and $N_2$ may be utilized in the LPCVD deposition process of the invention at a flow rate of 10 to 5000 sccm. Representative process conditions are as follows:
Temperature 40° C.–500° C.
Pressure 0.1 to 2 Torr
Flow rate of organometallic source 10 sccm
Flow rate of organic silane 20 sccm
Flow rate of inert carrier gas 50 sccm
Deposition rate 40 to 1000 Å/minute
Time of deposition 20 sec to 5 minutes.

Although the invention has been described with respect to preferred embodiments thereof, many variations and modifications will become apparent to those skilled in the art. It is therefore the intention that the appended claims be interpreted as broadly as possible in view of the prior art to include all such variations and modifications.

We claim:

1. A method of forming a mixed phase $TiN/TiSi_x$ layer in the fabrication of a semiconductor device, comprising the steps of:
   a. providing a semiconductor device under fabrication;
   b. placing the device in a vacuum chamber;
   c. applying a stream of a titanium source gas formed of an organometallic precursor within the vacuum chamber; and
   d. applying a stream of an organic silane reactive gas within the vacuum chamber;
   such that the titanium source gas and the silane reactive gas combine and deposit a film of mixed phase $TiN + TiSi_x$ on the semiconductor device.

2. The method as recited in claim 1 and wherein:
   the organometallic precursor is tetrakisdimethyl-amino titanium (TMAT).

3. The method as recited in claim 2 and wherein:
   the organic silane reactive gas is Tris(Dimethylamino)Silane (SIN).

4. The method as recited in claim 1 and further comprising:
   applying a carrier inert gas at a flow rate to control a gas distribution above the semiconductor device to control a uniformity of the deposited film.

5. The method as recited in claim 1 and wherein:
   the pressure in the vacuum chamber is between about 0.1 to 10 Torr.

6. The method as recited in claim 1 and wherein:
   a temperature in the vacuum chamber is between 40° C. to 500° C.

7. In semiconductor manufacture, an LPCVD method for depositing a mixed phase $TiN/TiSi_2$ film on a substrate comprising the steps of:
   a. placing the substrate in a vacuum chamber;
   b. combining an organometallic titanium source gas, a carrier gas and an organic silane reactive gas for a time period between about 20 seconds to about 5 minutes in the vacuum chamber to form and deposit a film of a $TiN/TiSi_2$ mixture on the substrate.

8. The method as recited in claim 7 and wherein:
   the organometallic titanium source gas is tetrakis-dimethyl-amino titanium (TMAT); and
   the organic silane reactive gas is Tris(Dimethylamino)Silane (SIN).

9. The method as recited in claim 8 and wherein: the carrier gas is selected from the group consisting of Hydrogen, Argon or Nitrogen.

10. The method as recited in claim 8 and wherein:
    a flow rate of the TMAT is about 3 to 200 sccm;
    a flow rate of the SIN is about 3 to 200 sccm; and
    a flow rate of the inert carrier gas is about 10 to 5000 sccm.

11. The method as recited in claim 10 and wherein:
    a pressure in the vacuum chamber is about 0.05 to 30 Torr.

12. The method as recited in claim 11 and wherein:
    a temperature in the vacuum chamber is from about 40° to 500° C.

13. In a semiconductor manufacturing process a LPCVD method of depositing a mixed phase $TiN/TiSi_2$ film on a substrate comprising the steps of:
    a. placing the substrate in a vacuum chamber at a pressure of from about 0.05 to 30 Torr;
    b. adjusting the temperature of the substrate to about 40° C. to 350° C.;
    c. applying a stream of an organometallic source gas of tetrakis-dimethyl-amino titanium (TMAT) within the vacuum chamber;
    d. applying a stream of an organic silane reactive gas of Tris(Dimethylamino)Silane (SIN) within the vacuum chamber;

e. combining the source gas and reactive gas to form a mixed phase TiN/TiSi$_2$ film on the substrate; and
f. controlling a uniformity of the film with a flow of carrier gas within the vacuum chamber.

14. The method as recited in claim 13 and wherein:
the method is carried out in a cold wall CVD reactor.

15. The method as recited in claim 14 and wherein:
the stream of TMAT is about 10 sccm;
the stream of SIN is about 20 sccm; and
the stream of inert gas is about 50 sccm.

16. The method as recited in claim 15 and wherein:
the deposited film is formed mostly of TiN and a small quantity of TiSi$_2$.

17. The method as recited in claim 16 and wherein:
the TiN/TiSi$_2$ film is deposited on a silicon substrate.

18. The method as recited in claim 17 and wherein:
the TiN/TiSi$_2$ film is deposited on a SiO$_2$ substrate.

* * * * *